United States Patent [19]
Ito et al.

[11] Patent Number: 6,008,859
[45] Date of Patent: Dec. 28, 1999

[54] IMAGE DATA PROCESSING APPARATUS

[75] Inventors: Hiroya Ito, Hashima; Masashi Kiyose, Gifu, both of Japan

[73] Assignee: Sanyo Electric Co., Ltd., Osaka, Japan

[21] Appl. No.: 08/903,389

[22] Filed: Jul. 30, 1997

[30] Foreign Application Priority Data

Jul. 31, 1996 [JP] Japan ................................. 8-202542
Jul. 31, 1996 [JP] Japan ................................. 8-202543

[51] Int. Cl.$^6$ ................................ H04N 9/45; H03L 7/00
[52] U.S. Cl. ..................... 348/540; 348/536; 348/505; 348/663; 348/194; 331/20; 331/18
[58] Field of Search .......................... 348/194, 505, 348/506, 540, 549, 663, 541, 539, 519, 518, 536, 544; 331/20, 18, 25, 16, 17; 327/513; H04N 9/45; H03L 7/00

[56] References Cited

U.S. PATENT DOCUMENTS

| | | | |
|---|---|---|---|
| 4,212,027 | 7/1980 | Lemoine | 348/498 |
| 4,251,831 | 2/1981 | Kamah | 358/21 |
| 4,688,081 | 8/1987 | Furuhata | 348/498 |
| 5,841,486 | 11/1998 | Ando | 348/673 |

*Primary Examiner*—John K. Peng
*Assistant Examiner*—Wesner Sajous
*Attorney, Agent, or Firm*—Sheridan Ross P.C.

[57] ABSTRACT

An image data processing apparatus is described that prevents the period of a horizontal timing signal from being shifted. The apparatus includes a separator, a phase-locked loop, a detector, a compensator and a timing signal generator. The detector delays a reference clock signal in a shorter period than the period of the reference clock signal, in a step-like manner, to produce a plurality of delayed timing signals having step-like phase differences. The detector further contrasts the plurality of delayed timing signals with a horizontal sync signal and the reference clock signal to measure the phase difference and the period of the horizontal sync signal. The compensator sets a ratio for combining consecutive luminance data in accordance with the phase difference and the period of the reference clock signal and combines consecutive luminance data in accordance with the ratio to generate compensated luminance data. The timing signal generator frequency-divides the reference clock signal in response to the horizontal sync signal to generate a timing signal for a horizontal scan.

9 Claims, 11 Drawing Sheets

IMAGE DATA PROCESSING APPARATUS

BACKGROUND OF THE INVENTION

1. Field of the Invention

The present invention relates generally to an image data processing apparatus. More particularly, this invention relates to an image data processing apparatus which separates an image signal to a luminance component and a chrominance component and produces luminance data and chrominance data through digital signal processing.

2. Description of the Related Art

An image signal for reproducing a color image on a monitor screen includes a luminance component, a chrominance component and a sync component. The luminance component represents the tone of an image. The chrominance component expresses color. The sync component represents information about various types of synchronizations, such as horizontal synchronization and vertical synchronization. Those components are separated from one another by utilizing characteristics like the difference in amplitude between the components and phase deviation, yielding a luminance signal, a chrominance signal and a sync signal. Image processing is performed using those signals. Digital signal processing which is not easily susceptible to temperature variance, noise, etc., is likely to be used in this image processing.

FIG. 1 is a block diagram showing an image data processing apparatus, which is based on digital signal processing. FIG. 2 is a waveform chart illustrating signals that are handled in the apparatus in FIG. 1.

The image data processing apparatus includes a Y/C separator 1, an amplifier 2, an A/D converter 3, a sync detector 4, a burst detector 5, a phase-locked loop (PLL) 6, a timing signal generator 7 and an image data processor 10.

The Y/C separator 1 receives an image signal i and separates the image signal to a luminance component and a chrominance component using the phase difference of the chrominance component, thereby yielding a luminance signal y and a chrominance signal c. In the case of the NTSC form, for example, the luminance component is acquired by adding an image signal, which is the image signal i shifted by one horizontal scan period, to the image signal i. The chrominance component is acquired from the difference between the image signal i and the shifted image signal.

The amplifier 2 is a 2-channel, high-frequency amplifier configured to operate in the video frequency band, which amplifies the amplitudes of the luminance signal y and chrominance signal c to predetermined amplitudes.

The A/D converter 3 receives the amplified luminance signal y and chrominance signal c from the amplifier 2 and quantizes the luminance signal y and chrominance signal c in accordance with a reference clock signal CK to yield luminance data Y0 and chrominance data C0.

The sync detector 4 receives the image signal i and obtains a sync component from the image signal i. The detector 4 also produces a horizontal sync signal HS and a vertical sync signal VS from the acquired sync component. In this sync detection, the mixture of the horizontal sync component and vertical sync component is acquired first using the difference between the amplitude of the sync component and the amplitudes of the other signal components. The mixed component is then separated into the horizontal sync component and vertical sync component using the difference in frequency between those components.

The burst detector 5 receives the image signal i and selectively extracts a burst signal CB, as shown in FIG. 2, from the image signal i for phase synchronization of the chrominance component. The burst signal CB has a fixed, predetermined frequency (e.g., 3.58 MHZ). The burst signal CB is previously superimposed on the image signal i at a predetermined position of the image signal i, e.g., at the back porch of each horizontal blanking period. The burst signal CB is therefore selectively extracted from the image signal i at the beginning of each horizontal scan period.

The PLL 6 receives the burst signal CB from the burst detector 5 based on which it produces the reference clock signal CK. In the NTSC form, for example, the PLL 6 is configured so that a clock signal obtained by frequency-dividing the reference clock signal CK by 4 becomes synchronous with the burst signal CB. Accordingly, the reference clock signal CK having a frequency of 14.32 MHZ is produced based on the burst signal CB that has a frequency of 3.58 MHZ. Normally, the reference clock signal CK of 14.32 MHZ is used as a color sub-carrier for the modulation of a chrominance component.

The timing signal generator 7 includes a counter which operates in accordance with the reference clock signal CK. The counter frequency-divides the reference clock signal CK in accordance with the horizontal sync signal HS and the vertical sync signal VS to produce a timing signal for the horizontal scan period and a timing signal for the vertical scan period. In the NTSC form, for example, the counter generates a horizontal timing signal HD every time it counts 910 clocks of the reference clock signal CK while resetting its own count value in accordance with the horizontal sync signal HS. The counter also generates a vertical timing signal VD every time it counts 525/2 pulses of the horizontal timing signal HD while resetting its own count value in accordance with the vertical sync signal VS.

The image data processor 8 receives the luminance data Y0 and chrominance data C0 from the A/D converter 3, piece by piece, and performs predetermined signal processing to produce new luminance data Y and color difference data U and V. The color difference data U and V respectively represent the differences between the luminance signal and the red and blue components.

The process of producing the luminance data Y involves processes such as an aperture process and a gamma compensation process. The aperture process is to emphasize the contrast of an image. The gamma compensation is to compensate a visual non-linearity with respect to the luminance level. The process of producing the color difference data U and V involves processes, such as color decoding of the chrominance component, which has previously undergone balanced modulation, and white balance adjustment. Thereafter, the subtraction between the individual chrominance components and the luminance component is performed.

The image data processor 8 adjusts the output timings for the luminance data Y0 and the chrominance data C0 in such a way that the luminance data Y and the color difference data U and V are sent to the recording system or the reproducing system at the same timing.

The horizontal sync signal HS for determining the timing for the luminance component and the burst signal CB for determining the timing for the chrominance component are asynchronous with each other. The horizontal sync signal HS has a longer period than the burst signal CB. When the image signal i is supplied from a reproducing apparatus like a video tape recorder, therefore, the horizontal sync signal HS is susceptible to the influence of jittering, which occurs in the reproducing apparatus. Because of this jittering, the timing signal generator 7 produces the horizontal timing signal HD, the period of which is shifted by one to several periods, based on the reference clock signal CK. In the NTSC form, for example, under a jitter-free environment, the horizontal timing signal HD, which has a period of 910 clocks of the reference clock signal CK, is generated. However, jittering, if present, may cause the horizontal timing signal HD, having a period of 908 to 912 clocks, to be generated. This shift of the period of the horizontal timing signal HD causes a relative phase deviation between the luminance data Y and the chrominance data C.

Further, the phase difference between the horizontal sync signal HS and the burst signal CB causes a relative difference between the sampling of the luminance component and the sampling of the chrominance component when D/A conversion is performed. This difference deteriorates the quality of the reproduced image. As shown in FIG. 3, suppose that the falling timing of the horizontal sync signal HS is delayed by a time Ta from the rising timing of the reference clock signal CK. In this case, the A/D converter 3 performs sampling at a timing shifted by the time Ta to generate image data Y0. The luminance signal y should be sampled in accordance with a clock signal CK', which is synchronous with the horizontal sync signal HS and has the same period as the reference clock signal CK. When the luminance signal y is sampled in accordance with the reference clock signal CK, however, luminance data Y0 the phase of which is shifted by the time Ta from that of the chrominance data C0, is produced. It is thus necessary to detect this time Ta and compensate the phase of either the luminance data Y0 or the chrominance data C0. One way of compensating the luminance data Y0 is to combine consecutive luminance data Y0(n) and Y0(n+1) by the ratio of Tb–Ta:Ta to thereby produce compensated luminance data Y1.

The phase difference of two kinds of signals is generally detected as follows. The counter starts pulse counting at a first specific timing corresponding to a change in one of the signals, and finishes the counting at a second specific timing corresponding to a change in the other signal. The phase difference is detected based on the value counted up from the beginning of the counting to the end thereof. The reference clock signal CK has a relatively high frequency (14.32 MHZ in the NTSC form). The detection of the phase difference between the reference clock signal CK and the horizontal sync signal HS, therefore, requires a clock signal having a higher frequency and a fast counter that operates in accordance with that clock signal. This results in an enlarged circuit area of the apparatus and increased power consumption.

SUMMARY OF THE INVENTION

Broadly speaking, the present invention relates to an image data processing apparatus which prevents the period of a horizontal timing signal from being shifted.

The present invention also relates to a phase difference detector, which is adaptable for use in an image data processing apparatus and which can accurately detect the phase difference between a horizontal sync signal and a burst signal without using a high-frequency signal. The present invention can be implemented in numerous ways including as an apparatus and a method.

One aspect of the present invention, an image data processing apparatus consecutively produces luminance data i and chrominance data from an image signal including a luminance component and a chrominance component. A horizontal sync signal and a color sync signal are overlaid on the image signal. The horizontal sync signal is used for determining a horizontal scan timing. The color sync signal is used to ensure synchronization for the chrominance component. The apparatus includes a separator, a phase-locked loop, a detector, a compensator and a timing signal generator. The separator separates the luminance component and the chrominance component from the image signal to produce a luminance signal and a chrominance signal. The phase-locked loop produces a reference clock signal synchronizing with the color sync signal and having a given period. The detector, which is connected to the phase-locked loop, detects a phase difference between the reference clock signal and the horizontal sync signal and a period of the reference clock signal. The detector delays the reference clock signal in a shorter period than the period of the reference clock signal, in a step-like manner, to produce a plurality of delayed timing signals having step-like phase differences. The detector further contrasts the plurality of delayed timing signals with the horizontal sync signal and reference clock signal to measure the phase difference and the period of the horizontal sync signal. The compensator, which is connected to the detector, sets a ratio for combining consecutive luminance data in accordance with the phase difference and the period of the reference clock signal and combines consecutive luminance data in accordance with the ratio to generate compensated luminance data. The timing signal generator, which is connected to the phase-locked loop and the detector, frequency-divides the reference clock signal in response to the horizontal sync signal to generate a timing signal for a horizontal scan.

Another aspect of the invention, a detector circuit detects a phase difference between a first clock signal and second clock signal. The first clock signal has a constant period. The second clock signal has a period acquired by multiplying the constant period by integer. The detector circuit includes a counter, a decoder, a first determining circuit, a synthesizer, a delay circuit, a second determining circuit and a third determining circuit. The counter counts the first clock signal and indicates a count value while resetting the count value in response to the second clock signal. The decoder, which is connected to the counter, receives and decoding the count value and generates a plurality of timing signals when the count value reaches a predetermined range including a predetermined value. The timing signals are shifted from one another by one clock period of the first clock signal and each holds a predetermined level for the one clock period. The first determining circuit, which is connected to the decoder, receives the plurality of timing signals in response to the second clock signal and determines a period of the second clock signal based on statuses of the timing signals. The synthesizer, which is connected to the decoder, permits passing of the first clock signal while any one of the plurality of timing signals is holding the predetermined level to produce a synthesized timing signal having the plurality of timing signals synthesized. The synthesizer further simultaneously generates a delayed first clock signal delayed by one clock period from the first clock signal. The delay circuit, which is connected to the synthesizer, for delays the synthesized timing signal in a shorter period than the period of the first clock signal, in a step-like manner, to produce a plurality of delayed timing signals having constant mutual phase differences in parallel. The second determining circuit, which is connected to the delay circuit, receives the plurality of delayed timing signals in response to the second clock signal and determines a phase difference between the first clock signal and the second clock signal based on statuses of the delayed timing signals. The third determining circuit, which is connected to the synthesizer and the delay circuit, receives the plurality of delayed timing signals in response to the delayed first clock signal and determines the period of the first clock signal based on the statuses of the delayed timing signals.

Yet another aspect of the invention, a delay circuit delays a rectangular wave signal in a predetermined time interval in a step-like manner to produce a plurality of delayed timing signals having constant mutual phase differences. The delay circuit includes a temperature compensation section and a plurality of series-connected delay sections. The temperature compensation section produces first and second control voltages that complementarily change in accordance with a temperature change. The temperature compensation section includes a resistor, a first MOS transistor, a first pair of complimentary MOS transistors and a second MOS transistor. The resistor and a first MOS transistor are connected in series between a high-potential voltage supply and a low-potential voltage supply. The first MOS transistor has a gate connected to a first node between the resistor and the first MOS transistor. The first control voltage is output from the first node. The first pair of complimentary MOS transistors, which are connected in series between the high-potential voltage supply and the low-potential voltage supply, each has a gate for receiving the first control voltage and a drain. The second control voltage is output from a second node between the first pair of complimentary MOS transistors. The second MOS transistor, which is connected one of the a first pair of complimentary MOS transistors in parallel, has a gate connected to the drain of associated one of the a first pair of complimentary MOS transistors. The plurality of series-connected delay sections, which are connected to the temperature compensation section, produces the plurality of delayed timing signals while keeping its own delay times at a constant in accordance with the first and second control voltages. Each of the delay sections includes a second pair of complimentary MOS transistors, a third MOS transistor and a fourth MOS transistor. The second pair of complimentary MOS transistors, which are connected in series between the high-potential voltage supply and the low-potential voltage supply, each has a gate for receiving an input signal. An associated one of the delayed timing signals is output from a third node between the second pair of complimentary MOS transistors. The third MOS transistor, which is connected between the second pair of complimentary MOS transistors and the high-potential voltage supply, has a gate for receiving one of the first and second control voltages. The fourth MOS transistor, which is connected between the second pair of complimentary MOS transistors and the low-potential voltage supply, has a gate for receiving a remaining one of the first and second control voltages.

Other aspects and advantages of the invention will become apparent from the following description, taken in conjunction with the accompanying drawings, illustrating by way of example the principals of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 4:
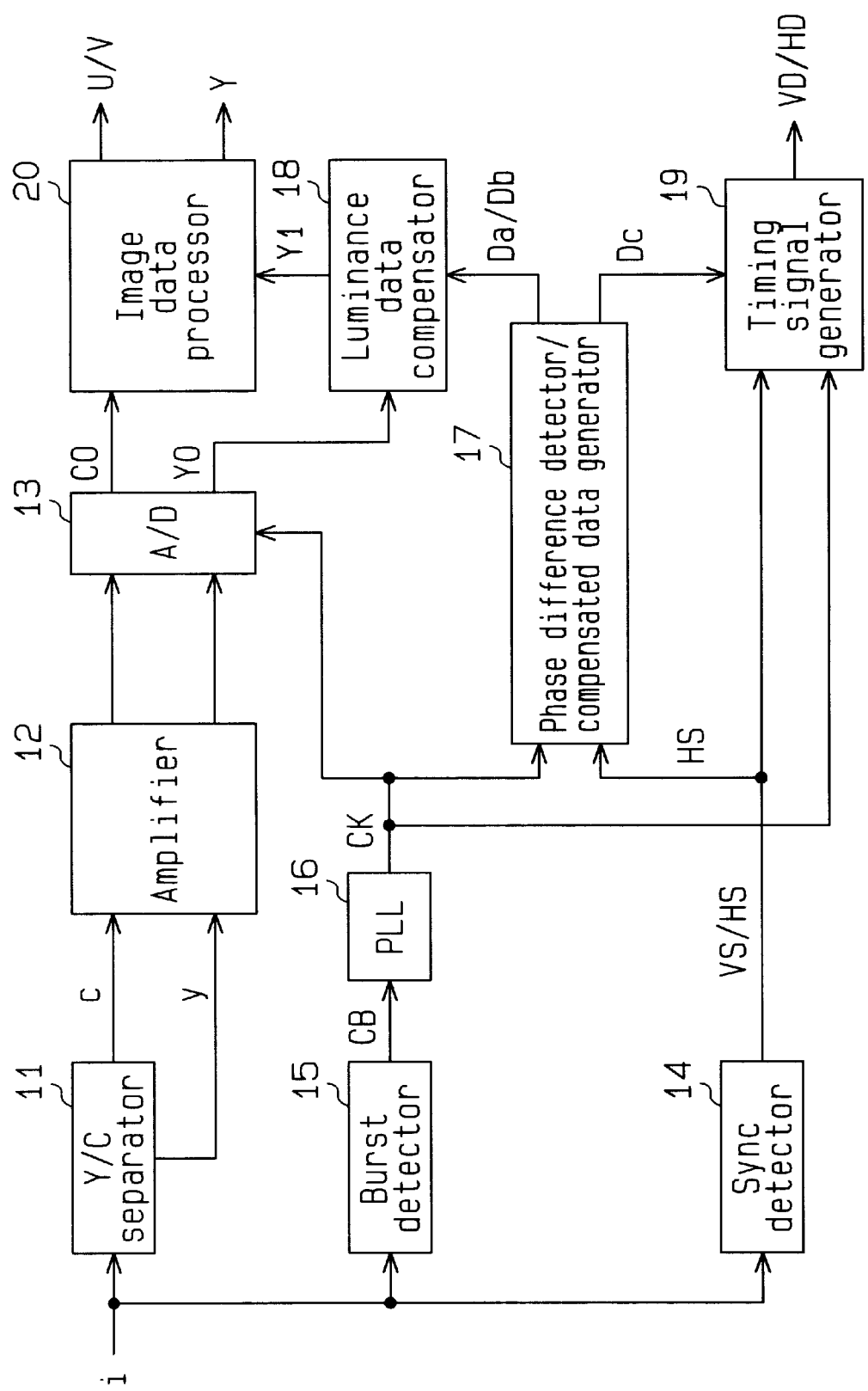
FIG. 4 is a block diagram showing an image data processing apparatus according to a first embodiment of the invention.

An image data processing apparatus according to a first embodiment of the present invention will now be described referring to the accompanying drawings. As shown in FIG. 4, the image data processing apparatus according to the first embodiment includes a Y/C separator 11, an amplifier 12, an A/D converter 13, a sync detector 14, a burst detector 15, a phase-locked loop (PLL) 16, a phase difference detector/compensated data generator 17, a luminance data compensator 18, a timing signal generator 19 and an image data processor 20.

Figure 1:
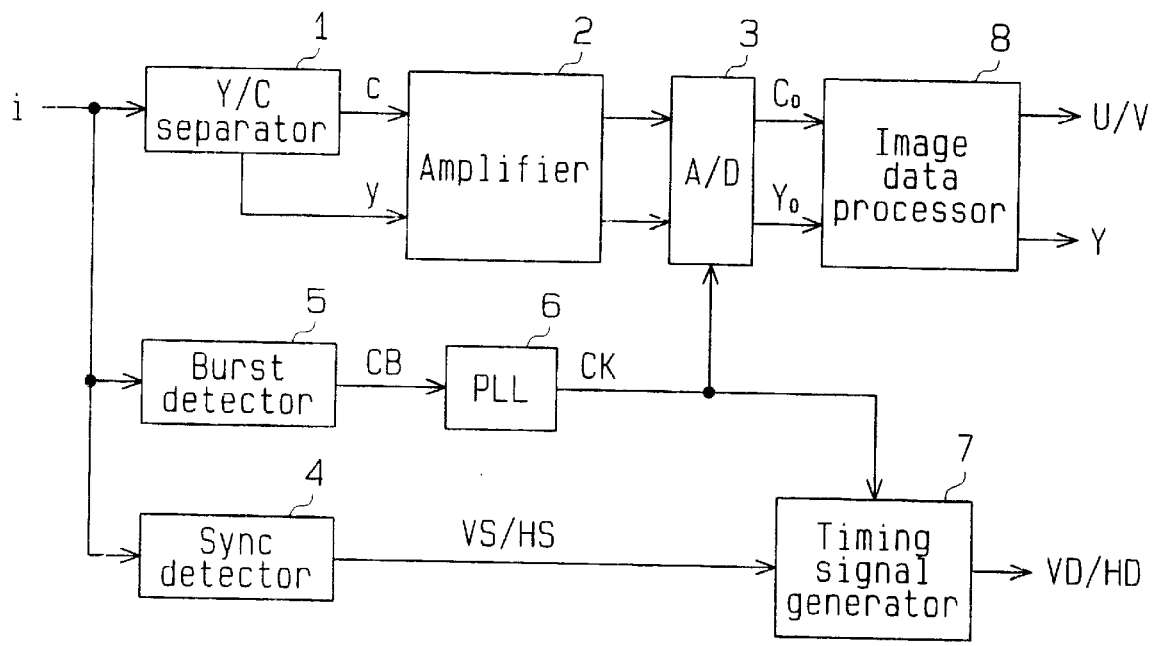
FIG. 1 is a block diagram showing an image data processing apparatus according to prior art.
Figure 2:
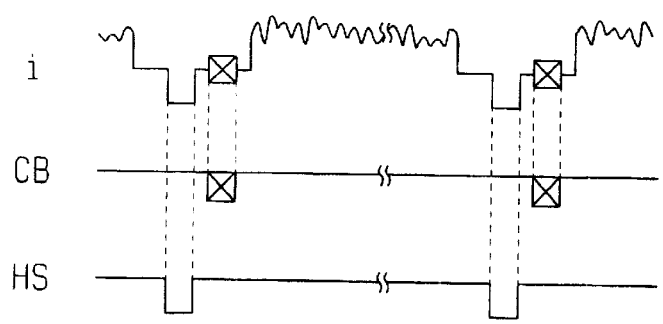
FIG. 2 is a waveform chart illustrating the relationship among an image signal, a burst signal and a horizontal sync signal.
Figure 3:
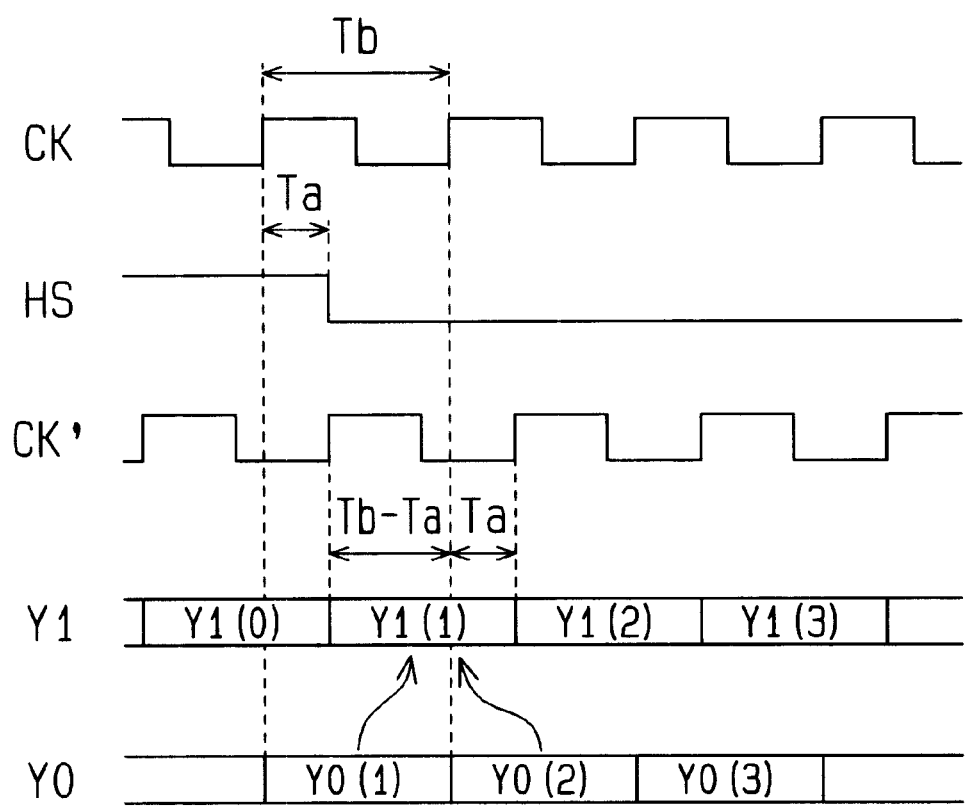
FIG. 3 is a timing chart illustrating compensation of luminance data in accordance with the phase difference between a reference clock signal and the horizontal sync signal.

The Y/C separator 11 receives an image signal i and separates a luminance component and a chrominance component from the image signal i to thereby produce a luminance signal y and a chrominance signal c. The amplifier 12 amplifies the separated luminance signal y and chrominance signal c to have a predetermined amplitude, respectively. The A/D converter 13 quantizes the amplified luminance signal y and chrominance signal c in a given period to produce luminance data Y0 and chrominance data C0. The Y/C separator 11, amplifier 12 and A/D converter 13 have the same structures as those of the prior art in FIG. 1.

The sync detector 14 receives the image signal i and extracts a sync component from the image signal i. The detector 14 produces a horizontal sync signal HS and a vertical sync signal VS based on that sync component. The horizontal sync signal HS determines the timing for the horizontal scanning, and the vertical sync signal VS determines the timing for the vertical scanning.

The burst detector 15 receives the image signal i and selectively extracts a burst signal (color sync signal) CB from the image signal i. The burst signal CB is a signal superimposed on the image signal i in a specific period, and is used for phase synchronization for the chrominance component.

The PLL 16 receives the burst signal CB from the burst detector 15, and the PLL 16 produces a reference clock signal CK having a given period based on the burst signal CB. This reference clock signal CK is supplied to the A/D converter 13. Thus, the A/D converter 13 uses the reference clock signal CK as a sampling clock signal. According to the first embodiment, which conforms to the NTSC form, the PLL circuit 16 is configured so that a clock signal obtained by frequency-dividing the reference clock signal CK by 4 becomes synchronous with the burst signal CB.

Figure 5:
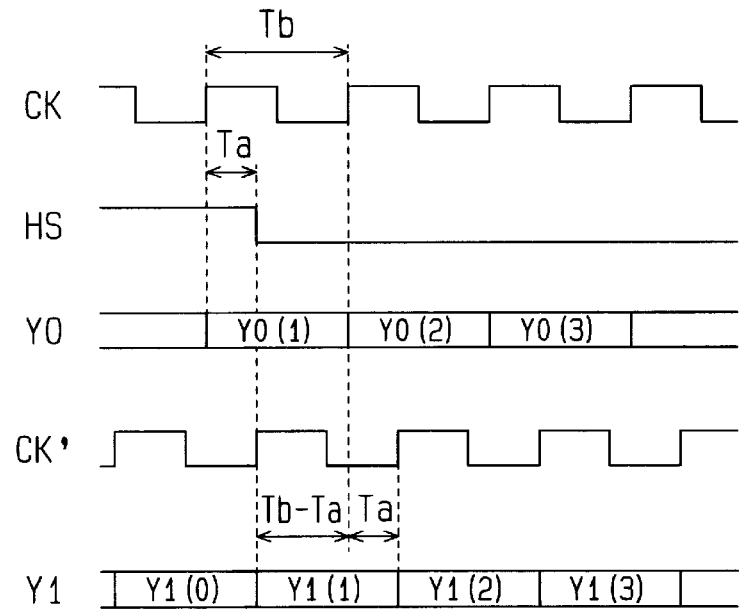
FIG. 5 is a timing chart illustrating compensation of luminance data, which is executed by the apparatus in FIG. 4.

The phase difference detector/compensated data generator 17 receives the reference clock signal CK from the PLL circuit 16 and receives the horizontal and vertical sync signals HS and VS from the sync detector 14. Suppose that there is a deviation of a time Ta between the reference clock signal CK and the horizontal sync signal HS as shown in FIG. 5. Then, the generator 17 detects the time Ta from the rising edge of the reference clock signal CK to the falling edge of the horizontal sync signal HS and the period Tb of the reference clock signal CK. The generator 17 outputs phase difference data Da indicating that time Ta, and period data Db indicating that period Tb.

At the same time, the generator 17 measures the period of the horizontal sync signal HS using the reference clock signal CK. The generator 17 further compares the measured period with a reference period to detect a period shifted from the period of the reference clock signal CK. The generator 17 outputs compensated data Dc representing the shifted period.

The luminance data compensator 18 receives the phase difference data Da and the clock period data Db from the compensated data generator 17 and receives the luminance data Y0 from the A/D converter 13. Based on the phase difference data Da and the clock period data Db, the compensator 18 compensates the luminance data Y0 piece by piece to produce compensated luminance data Y1.

Specifically, the compensator 18 is configured to perform an arithmetic operation according to the following equation 1 on the consecutive pieces of luminance data Y0(n), thereby producing compensated luminance data Y1(n).

$$Y1(n) = \left(1 - \frac{Da}{Db}\right) Y0(n-1) + \frac{Da}{Db} Y0(n) \quad (1)$$

The compensated luminance data Y1(n) is acquired by combining one piece of luminance data Y0(n) and the immediately previous luminance data Y0(n−1). The combining ratio is set to Db−Da:Da (Tb−Ta:Ta). As shown in FIG. 5, the compensated luminance data Y1(n) is synchronous with a sampling clock signal CK' synchronized with the horizontal sync signal HS. In other words, even though the horizontal sync signal HS is shifted by the time Ta from the reference clock signal CK, the sampling clock signal CK' or the compensated luminance data Y1(n) synchronous with the horizontal sync signal HS can be acquired.

The timing signal generator 19 receives the reference clock signal CK from the PLL circuit 16, the compensated data Dc from the compensated data generator 17, and the vertical and horizontal sync signals VS and HS from the sync detector 14. The generator 19 has a counter (not shown) for counting the pulses of the reference clock signal and a decoder for decoding the count value of the counter. The generator 19 produces vertical and horizontal timing signals VD and HD from the vertical and horizontal sync signals VS and HS based on the count value. The counter of the timing signal generator 19 is configured to operate in accordance with the vertical and horizontal scan periods.

Further, the timing signal generator 19 alters the timing for generating the horizontal timing signal HD, clock by clock, based on the compensated data Dc. Suppose that the compensated data generator 17 has determined that the period of the horizontal sync signal HS is shorter by one period of the reference clock signal CK from the reference period. Then, the generator 19 decreases the decode value of the decoder in such a way that the period of the horizontal timing signal HD becomes shorter by one clock period. When the period of the horizontal sync signal HS is shifted due to jittering, therefore, the timing signal generator 19 changes the timing for generating the horizontal timing signal HD in such a way as to compensate for the shift.

The image data processor 20 receives the compensated luminance data Y1 from the luminance data compensator 18 piece by piece and receives the chrominance data C0 from the A/D converter 13 piece by piece. The processor 20 performs predetermined signal processing on the compensated luminance data Y1 and chrominance data C0 to generate new luminance data Y and color difference data U and V. This processor 20 performs processes such as an aperture process and a gamma compensation process to generate luminance data Y similarly to the case of image data processor 8 of the prior art shown in FIG. 1, thereby performing color decoding and white balance adjustment to generate color difference data U/V.

The A/D converters 13 operates in accordance with one clock signal. Therefore, the input timing for the compensated luminance data Y1 to the image data processor 20 substantially coincides with the input timing for the chrominance data C0 to the processor 22. This makes it unnecessary to adjust the input timings for both data.

With the above-described structure, the luminance data compensator 18 compensates an error in the luminance data Y0 caused by the phase difference between the horizontal sync signal HS and the burst signal CB. This compensation can provide the optimal luminance data Y1 corresponding to the chrominance data C0. In other words, the phase difference between the luminance data Y0 and the chrominance data C0 is eliminated. This prevents the disturbance of the outline of a subject on the reproduction screen.

Further, when the period of the horizontal sync signal HS is shifted, the period of the horizontal timing signal HD is changed to compensate for the shift by using the timing signal generator 19. Therefore, the phase difference between luminance data and chrominance data in each horizontal scan period is effectively compensated by using the altered horizontal timing signal HD.

Figure 6:
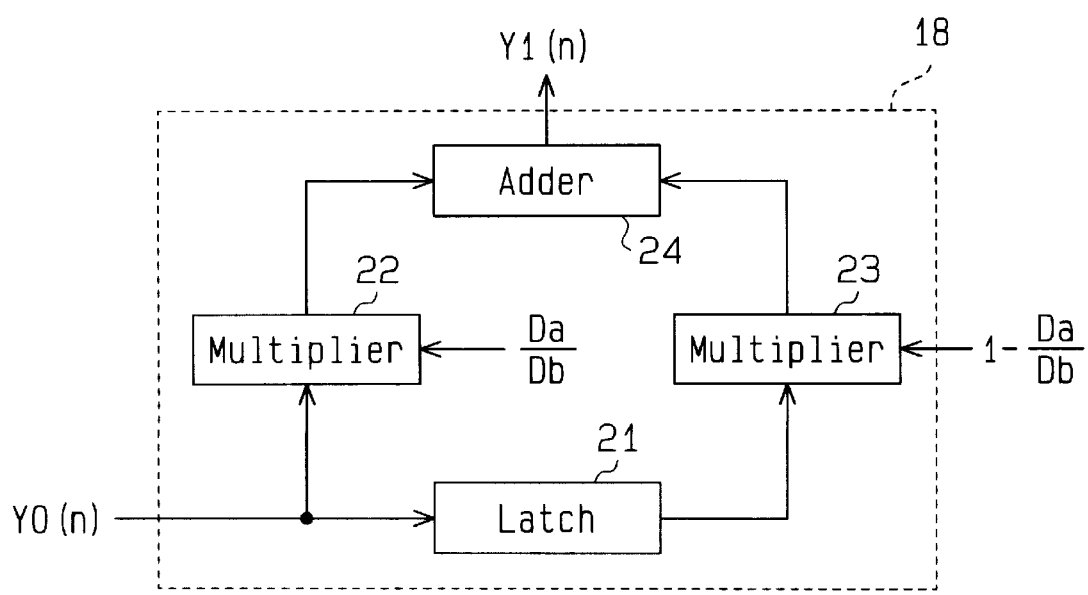
FIG. 6 is a block diagram of a luminance data compensator incorporated in the apparatus in FIG. 1.

As shown in FIG. 6, the luminance data compensator 18 includes a latch 21, first and second multipliers 22 and 23 and an adder 24.

The latch 21 consecutively receives the image data Y0(n) from the A/D converter 13 piece by piece, and holds that image data Y0(n) for one clock period. This image data Y0(n) is output from the latch 21 at a timing based on the reference clock signal CK.

The first multiplier 22 performs the operation of the second term on the right-hand side of the equation 1. That is, the first multiplier 22 receives the luminance data Y0(n) from the A/D converter 13 and multiplies that luminance data Y0(n) by a coefficient (Da/Db) to yield a first multiplication result.

The second multiplier 23 performs the operation of the first term on the right-hand side of the equation 1. That is, the second multiplier 23 receives the previous-by-one luminance data Y0(n−1) from the latch 21 and multiplies that luminance data Y0(n−1) by a coefficient (1−Da/Db) to yield a second multiplication result.

The adder 24 receives the first and second multiplication results from the first and second multipliers 22 and 23 and adds both to yield compensated luminance data Yn(n). The above structure allows the operation according to the equation 1 to be performed to provide new luminance data Y1(n) whose error originating from the phase difference between the reference clock signal CK and the horizontal sync signal HD0 has been compensated.

Figure 7:
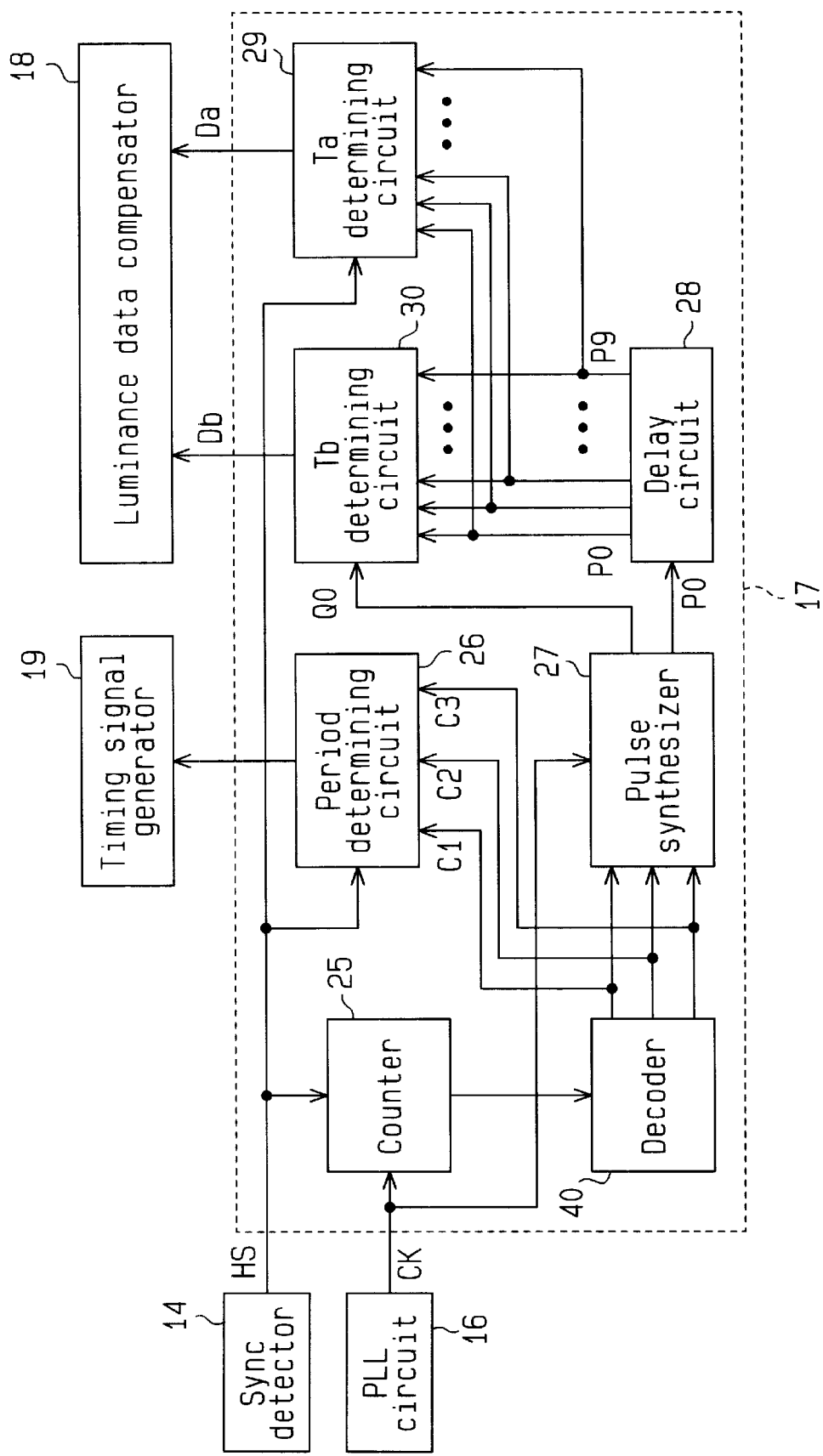
FIG. 7 is a block diagram of a phase difference detector/compensated data generator incorporated in the apparatus in FIG. 1.

As shown in FIG. 7, the phase difference detector/compensated data generator 17 includes a counter 25, a decoder 40, a period determining circuit 26, a pulse synthesizer 27, a delay circuit 28, a deviation time (Ta) determining circuit 29 and a period (Tb) determining circuit 30. The compensated data generator 17 in this embodiment determines a deviation of the period of the horizontal sync signal HS within one period of the reference clock signal CK, and expresses the phase difference between the reference clock signal CK and the horizontal sync signal HS in eight levels. That is, the phase difference between the reference clock signal CK and the horizontal sync signal HS is determined every one eighth of the period of the reference clock signal CK.

The counter 25 receives the reference clock signal CK from the PLL circuit 16 and counts the pulses of that reference clock signal CK. The decoder 40 receives the count value from the counter 25 and decodes the count value. When the decoded count value reaches predetermined count values, the decoder 40 outputs three kinds of pulse signals C1 to C3 each of which holds a high level for one clock period. Specifically, when the count value reaches a predetermined count value corresponding to the ratio of the period of the reference clock signal CK to the period of the horizontal sync signal HS, the decoder 40 outputs the pulse signal C2, which holds a high level for one clock period. The decoder 40 further outputs the pulse signal C1 or C3, which holds a high level for one clock period preceding or succeeding the pulse signal C2. According to the NTSC form, for example, the reference clock signal CK having a frequency of 14.32 MHZ is used. The decoder 40 outputs the pulse signal C2 when counting 910 pulses of the reference clock signal CK, outputs the pulse signal C1 when counting 909 clock pulses, and outputs the pulse signal C3 when counting 911 clock pulses. The decoder 40 is further configured to reset the count value in response to the falling edge of the horizontal sync signal HS and then repeats counting. When the horizontal sync signal HS has a very short period, therefore, the pulse signal C2 or C3 may not be produced.

Figure 8:
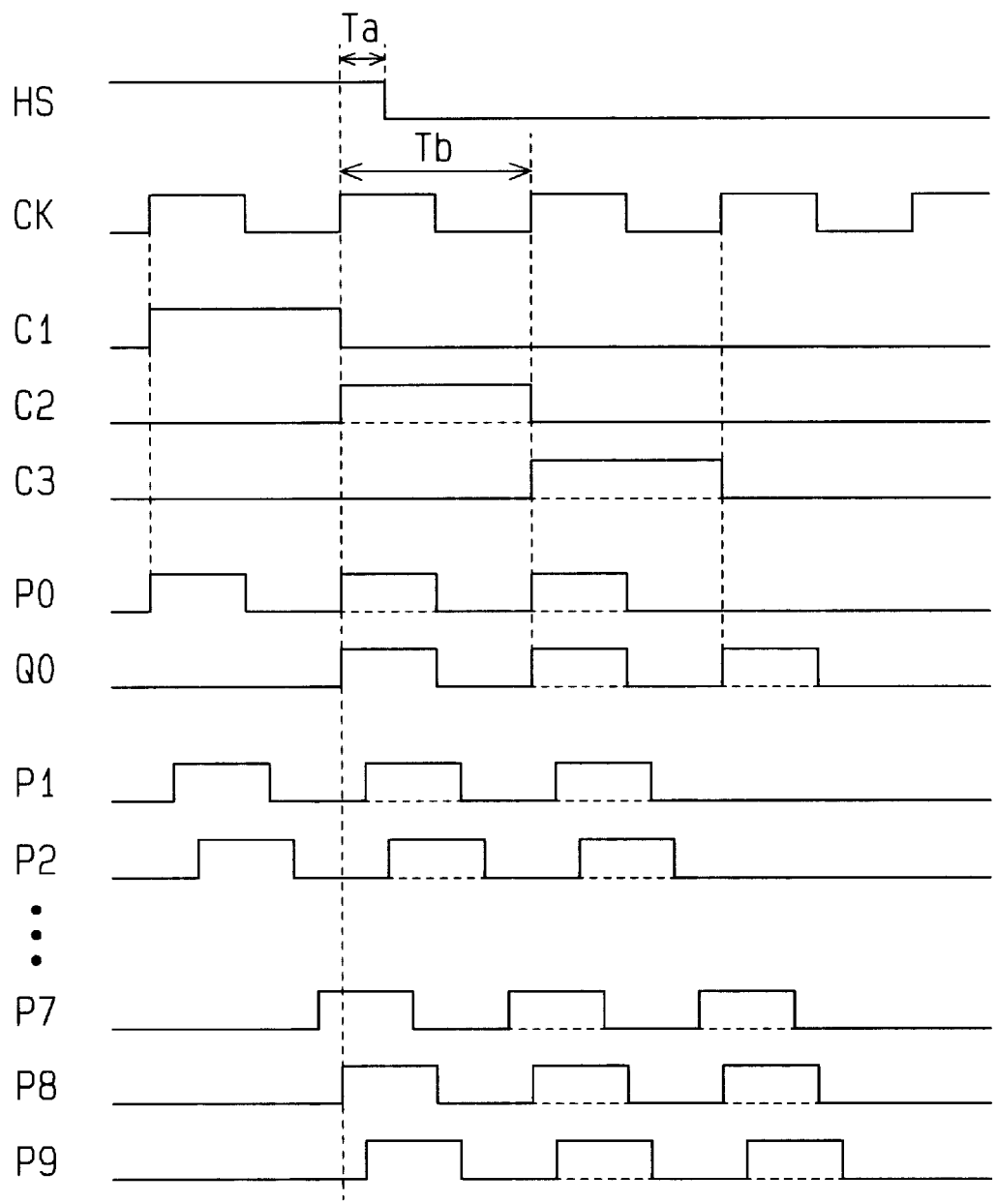
FIG. 8 is a timing chart which is referred to in explaining the operation of the compensated data generator in FIG. 7.

The period determining circuit 26 receives one of the pulse signals C1–C3 from the decoder 40 in response to the falling edge of the horizontal sync signal HS and determines the period of the horizontal sync signal HS based on the relationship between each pulse signal C1, C2 or C3 at that time with the horizontal sync signal HS. The result of this determination is output as the compensated data Dc. When receiving the high-level pulse signal C2 in response to the falling edge of the horizontal sync signal HS, as shown in FIG. 8, the determining circuit 26 determines that the horizontal sync signal HS having a predetermined period is output. When receiving the high-level pulse signal C1 in response to the falling edge of the horizontal sync signal HS, the determining circuit 26 determines that the horizontal sync signal HS whose period is shorter from the predetermined period by one clock is output. When receiving the high-level pulse signal C3 in response to the falling edge of the horizontal sync signal HS, the determining circuit 26 determines that the horizontal sync signal HS, the period of which is longer than the predetermined period by one clock, is output.

The pulse synthesizer 27 is configured to receive the reference clock signal CK and the pulse signal C1, C2 or C3 from the decoder 40 and produce a clock pulse signal P0 corresponding to the reference clock signal CK while that pulse signal C1, C2 or C3 is holding a high level. In other words, the pulse synthesizer 27 generates the clock pulse signal P0 by permitting the reference clock signal CK to pass through during the high-level duration of each pulse signal C1, C2 or C3.

The pulse synthesizer 27 delays the clock pulse signal P0 by one clock of the reference clock signal CK and sends a resultant delayed clock pulse signal Q0 to the period (Ta) determining circuit 30 so that the determining circuit 30 can determine the period of the reference clock signal CK.

The delay circuit 28 includes a plurality of delay elements (not shown) which have the same delay time and are connected in series. The delay circuit 28 receives the clock pulse signal P0 from the pulse synthesizer 27 and delays this clock pulse signal step by step by using the delay elements, thereby producing a plurality of clock pulses P1 to P9 having a specific mutual phase difference. It is preferable to set the phase difference among those clock pulses P0–P9 in accordance with the precision of determining the phase difference between the reference clock signal CK and the horizontal sync signal HS. Since the reference clock signal CK having a frequency of 14.32 MHZ is used in this embodiment, the phase difference among the clock pulses P0–P9 is set to 9 nsec. In the above manner, ten kinds of clock pulse signals P0–P9 are output from the delay circuit 28. When the pulse signal C3 or the pulse signal C2 or C3 is not generated, clock pulse signals P0 to P9 each having only one or two pulses are generated.

The deviation time (Ta) determining circuit 29 receives the clock pulse signals P0–P9 from the delay circuit 28 in response to the falling edge of the horizontal sync signal HS and determines the time Ta from the rising edge of the reference clock signal CK to the falling edge of the horizontal sync signal HS based on the statuses of the received signals. That is, the Ta determining circuit 29 determines the time Ta based on the positions at which the statuses of the individual clock pulse signals P0–P9 are changed.

Assume that when the horizontal sync signal HS falls, the clock pulse signals P0–P9 have the levels of "HHLLLLH-HHH". In this case, the Ta determining circuit 29 determines that the time Ta corresponds to the transition period from "H" to "L" or a period between 9 to 18 nsec. Every time the position that shows such transition is shifted by one, the time Ta is shifted by 9 nsec. As the time Ta is set to a multiple of 9 nsec, the Ta determining circuit 29 produces phase difference data Da representing that time Ta. Such setting of the time Ta is based on the fact that, as long as the reference clock signal CK is holding a specific period Tb, the time Ta corresponds to any one of eight equally divided portions of the period Tb. Therefore, the Ta determining circuit 29 can output eight kinds of phase difference data Da by distinguishing the statuses of the individual clock pulse signals P0–P9.

The period (Tb) determining circuit 30 receives the clock pulse signals P0–P9 in response to the rising edge of the reference clock signal CK and determines the period Tb of the reference clock signal CK based on the statuses of those clock pulse signals. That is, the Tb determining circuit 30 determines the period Tb based on the positions at which the statuses of the individual clock pulse signals P0–P9 are changed.

Suppose that when the reference clock signal CK rises, the clock pulse signals P0–P9 have the levels of "LLLLH-HHHLL". In this case, the Tb determining circuit 30 determines that the period Tb corresponds to the transition period from "H" to "L" or a period between 63 to 72 nsec. As the period Tb is set to a multiple of 9 nsec, the Tb determining circuit 30 produces clock period data Db representing that period Tb.

When the PLL circuit 16 is operating normally, in general, the period of the reference clock signal CK does not vary much and the clock period data Db of "8" is output. When the period of the reference clock signal CK varies for some reason, however, the clock period data Db of "7" or "9" is output. Since the period Tb is determined by using ten kinds of clock pulse signals P0–P9 in this embodiment, it is possible to secure a margin for such clock period data. The phase difference data Da and the clock period data Db, obtained in the above-described manner, are expressed simply by integers and are held for one horizontal scan. The luminance data compensator 18 determines the combining ratio of the luminance data Y0 by using the phase difference data Da and the clock period data Db.

When the horizontal sync signal HS is shifted by two or more clock periods from a predetermined period, the period of the horizontal sync signal cannot be determined with this structure. To detect the deviation of the horizontal sync signal HS by two clock periods, the compensated data generator 17 may be configured as follows. The counter 25 generates five kinds of pulse signals each having a high level for one clock period while shifting them by one clock period from one another. The period determining circuit 26 receives the five types of pulse signals in response to the falling edge of the horizontal sync signal HS. Normally, the period of the horizontal sync signal HS is not shifted significantly. To be specific, the horizontal sync signal HS is generally shifted around a predetermined period by one clock period or two clock periods. Most periods of the horizontal sync signal can therefore be determined by using the five types of pulse signals.

To determine the phase difference between the reference clock signal CK and the horizontal sync signal HS more finely, the number of delayed clock pulse signals may be increased. For this purpose, the delay circuit 28 requires many delay elements which operate with a short delay time. Further, the Ta determining circuit 29 and Tb determining circuit 30 need an increased number of determination bits in order to receive lots of clock pulse signals and make decision based thereon. It is effective to provide a visual effect if one period of the reference clock signal CK (14.23 MHZ) is divided into 16 or greater sub-periods based on which the determining operation is to be performed.

As apparent from the above, the use of the pulse synthesizer 21, which combines the three pulse signals C1–C3 to generate the clock pulse signal P0, permits the detection of the phase difference Ta to be detected by using one system of the delay circuit 28 and the determining circuits 23 and 24. In other words, the phase difference between the horizontal sync signal and the reference clock signal can be detected easily without using a clock signal that has a high frequency. Further, the phase difference can be finely detected within one clock period of the reference clock signal CK.

The period determining circuit 26 can detect a shift of the period of the horizontal sync signal HS every one clock a period of the reference clock signal CK.

Figure 9:
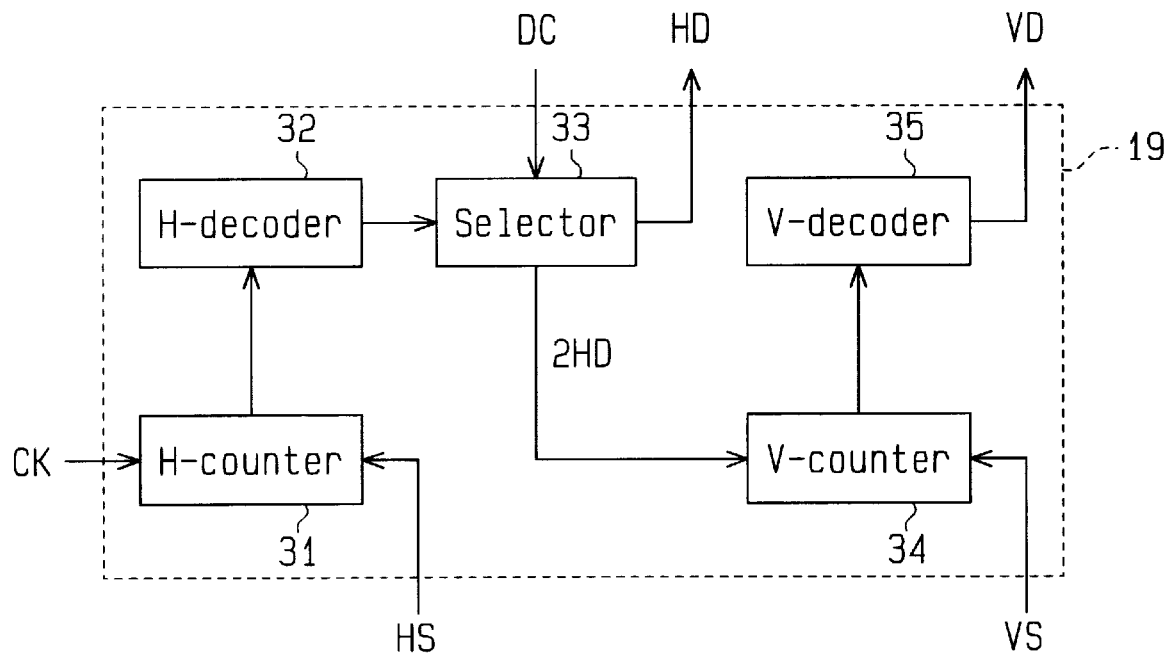
FIG. 9 is a block diagram of a timing signal generator incorporated in the apparatus in FIG. 1.
Figure 10:
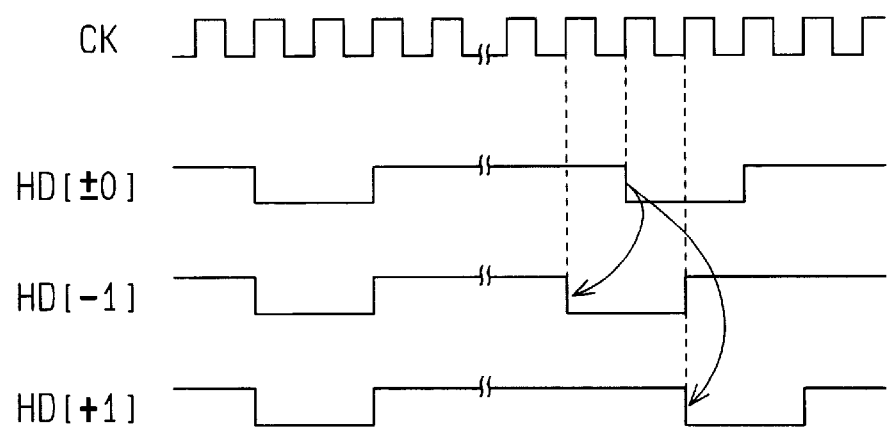
FIG. 10 is a timing chart which is referred to in explaining the operation of the timing signal generator in FIG. 9.

As shown in FIG. 9, the sync signal generator 19 includes an H counter 31, an H decoder 32, a selector 33, a V counter 34 and a V decoder 35. This sync signal generator 19, which corresponds to the compensated data generator 17 in FIG. 7, compensates the horizontal sync signal HS that has been shifted by one clock of the reference clock signal CK.

The H counter 31 receives the reference clock signal CK from the PLL circuit 16 and counts the pulses of the reference clock signal CK while performing the reset operation in response to the horizontal sync signal HS. The count value of the H counter 31 is supplied to the H decoder 32.

The H decoder 32 receives the count value from the H counter 31 and decodes it. The H decoder 32 further causes the horizontal timing signal HD to rise when the decoded count value reaches a predetermined count value. This H decoder 32 has a predetermined reference decode value and two predetermined decode values which are the reference decode value added with ±1. Therefore, the H decoder 32 generates three kinds of horizontal timing signals HD[±0], HD[−1] and HD[+1] using those three predetermined decode values. According to this embodiment, the three predetermined decode values are set to "909", "910" and "911". The H decoder 32 outputs the horizontal timing signals HD[±0], HD[−1] and HD[+1], which have periods corresponding to the respective decode values.

The selector 33 receives the compensated data Dc from the compensated data generator 17 and the three types of horizontal timing signals from the H decoder 32, and selectively outputs one of the horizontal timing signals HD[±0], HD[−1] and HD[+1] in accordance with the compensated data Dc.

The V counter 34 receives the selected horizontal timing signal HD from the selector 33, and counts the pulses of the selected horizontal timing signal HD while performing the reset operation in response to the vertical sync signal VS. The count value of the V counter 34 is supplied to the V decoder 35. According to this embodiment, the V counter 34 is configured to generate a clock signal, the period of which is a half of the period of the horizontal timing signal HD, and count the pulses of that clock signal.

The V decoder 35 receives the count value from the V counter 34 and decodes it. The V decoder 35 causes the vertical timing signal VD to rise when the decoded count value reaches a predetermined count value. According to this embodiment, the V decoder 35 causes the vertical timing signal VD to rise when the decoded count value reaches the predetermined count value "525". This structure ensures the generation of the vertical timing signal VD corresponding to the interlace scanning. That is, the horizontal scan timing is shifted by a half the horizontal scan period in each vertical scan period.

When the period of the horizontal sync signal HS is changed, the H counter 31 may perform the reset operation before the count value reaches the predetermined count value. To prevent such a reset operation, it is preferable to offset the count value from "0" when the count value is reset. When the count value is reset, for example, the count value is set to "10". The H counter 31 is configured to start counting from the count value "10" and keep counting until the count value reaches "920".

An image data processing apparatus according to the second embodiment of this invention will be discussed below with reference to the accompanying drawings. To avoid a redundant description, like or same reference numerals are given to those components that are the same as the corresponding components of the first embodiment. The image data processing apparatus according to the second embodiment performs Y/C separation in digital processing.

Figure 11:
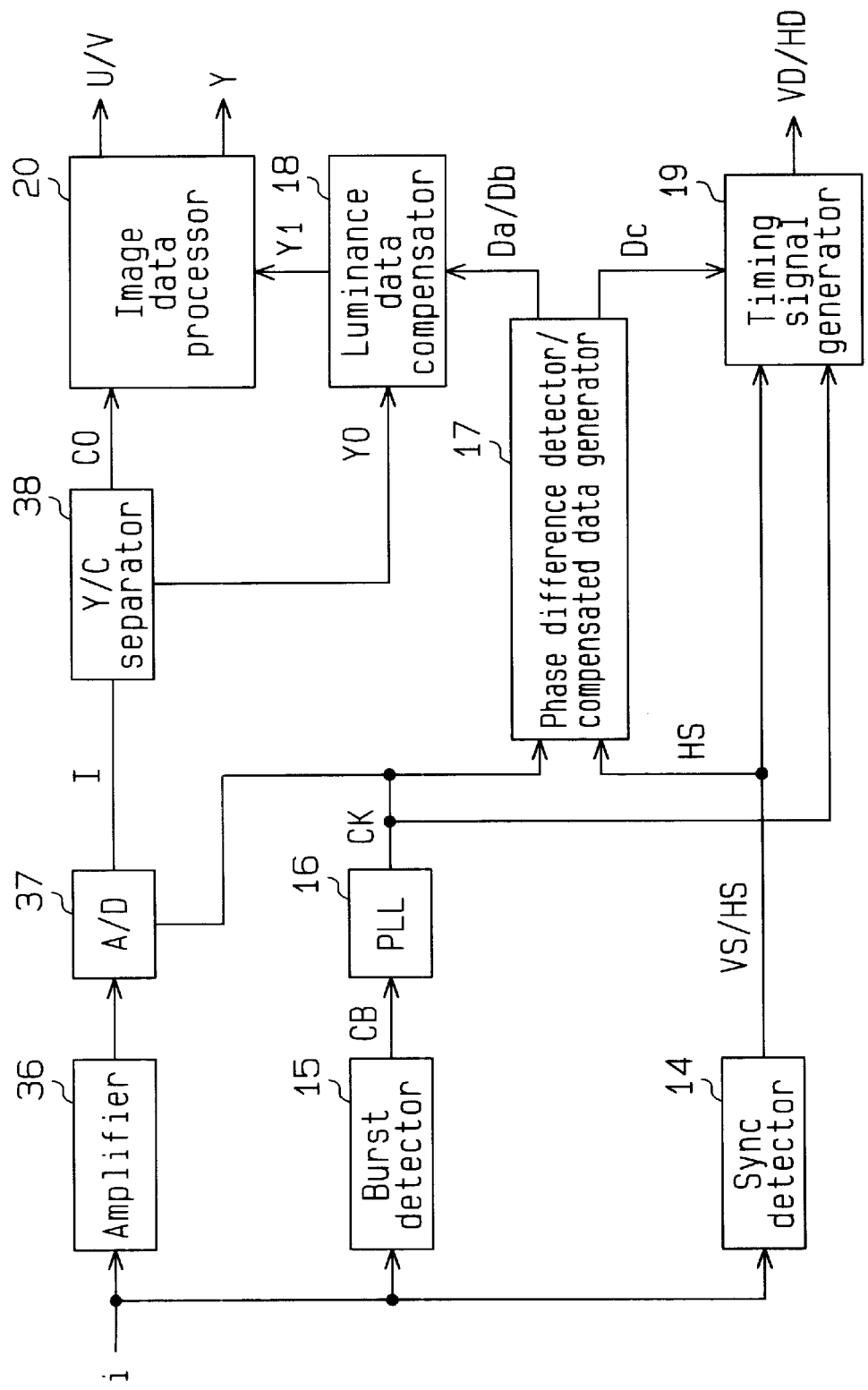
FIG. 11 is a block diagram illustrating an image data processing apparatus according to a second embodiment of the invention.

As shown in FIG. 11, the image data processing apparatus of the second embodiment includes a sync detector 14, a burst detector 15, a PLL 16, a phase difference detector/ compensated data generator 17, a luminance data compensator, a timing signal generator 19, an image data processor 20, an amplifier 36, an A/D converter 37 and a Y/C separator 38.

The amplifier 36 is a high-frequency amplifier for the video signal band, which receives the image signal i and amplifies the amplitude of the image signal i to a predetermined level. The A/D converter 37 quantizes the amplified image signal i in accordance with the reference clock signal CK to produce image data I.

The Y/C separator 38 receives the image data I from the A/D converter 37 and separates a luminance component and a chrominance component from the image data I to produce luminance data Y0 and chrominance data C0. According to the second embodiment, in accordance with the NTSC form, the Y/C separator 38 generates the luminance data Y0 by digitally adding the image data I to image data of the same column, shifted from the image data I by one horizontal scan period. The Y/C separator 38 generates the chrominance data C0 by digitally subtracting image data, shifted from the image data I, from the image data I.

The luminance data compensator 18 receives the luminance data Y0 from the Y/C separator 38 and supplies compensated luminance data Y1 to the image data processor 20. The image data processor 20 receives the compensated luminance data Y1 from the luminance data compensator 18 and the chrominance data C0 from the Y/C separator 38.

According to the second embodiment, because an image signal is processed using the single amplifier 36 and the single A/D converter 37, the circuit area is further reduced. As the ratio of the digital circuit section in the image data processing apparatus is increased, this image data processing apparatus is not easily affected by noise and has an improved operational characteristic.

Figure 12:
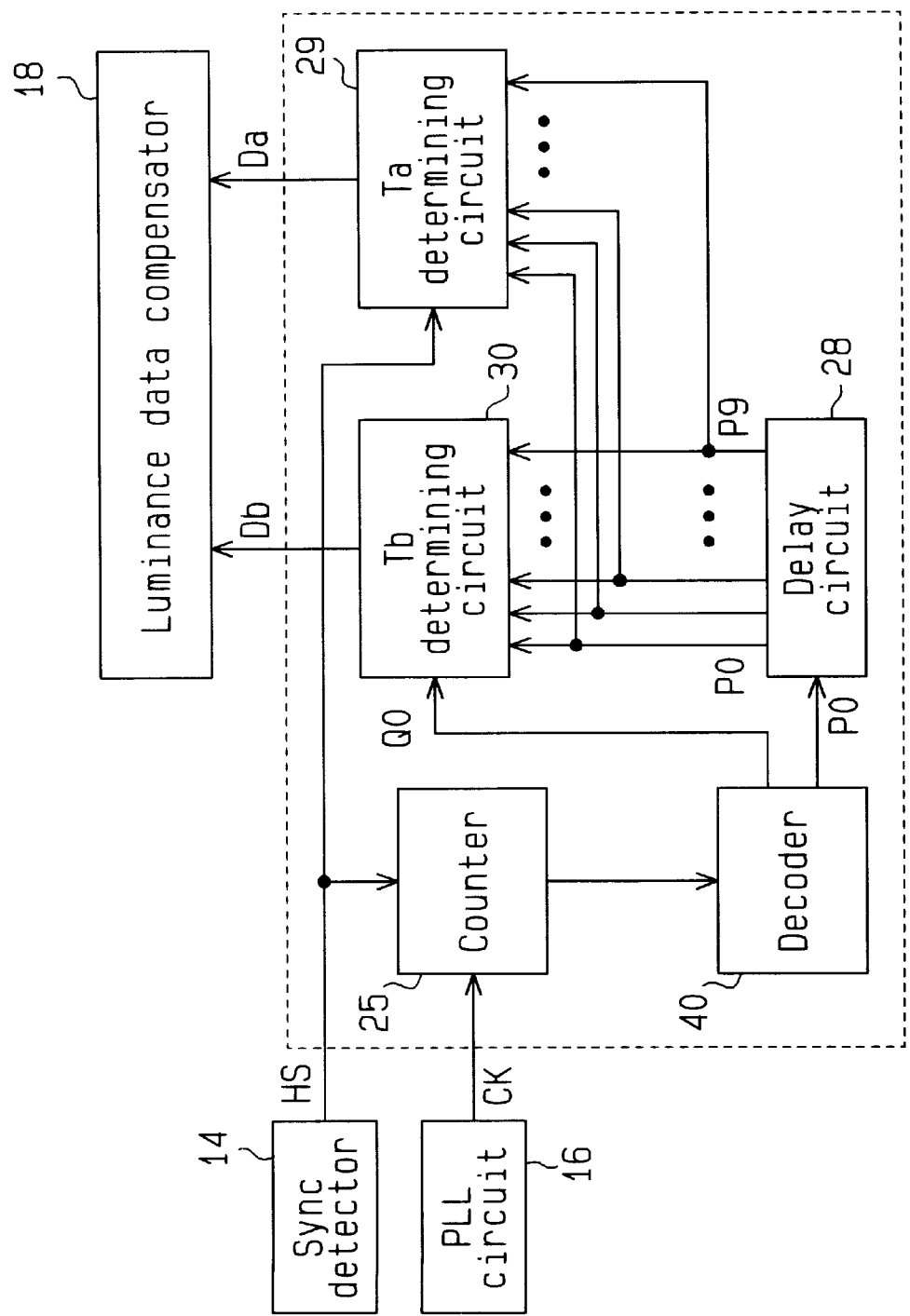
FIG. 12 is a block diagram of a phase difference detector to be incorporated in the image data processing apparatus.

FIG. 12 presents a block diagram showing a phase difference detector which is adaptable for use in an image data processing apparatus. To avoid a redundant description, like or same reference numerals are given to those components that are the same as the corresponding components of the phase difference detector/compensated data generator 17 in FIG. 7. This phase difference detector has no period determining circuit for determining the period of the horizontal sync signal HS.

The phase difference detector in FIG. 12 includes a counter 25, a decoder 40', a delay circuit 28, a deviation time (Ta) determining circuit 29 and a period (Tb) determining circuit 30.

Figure 13:
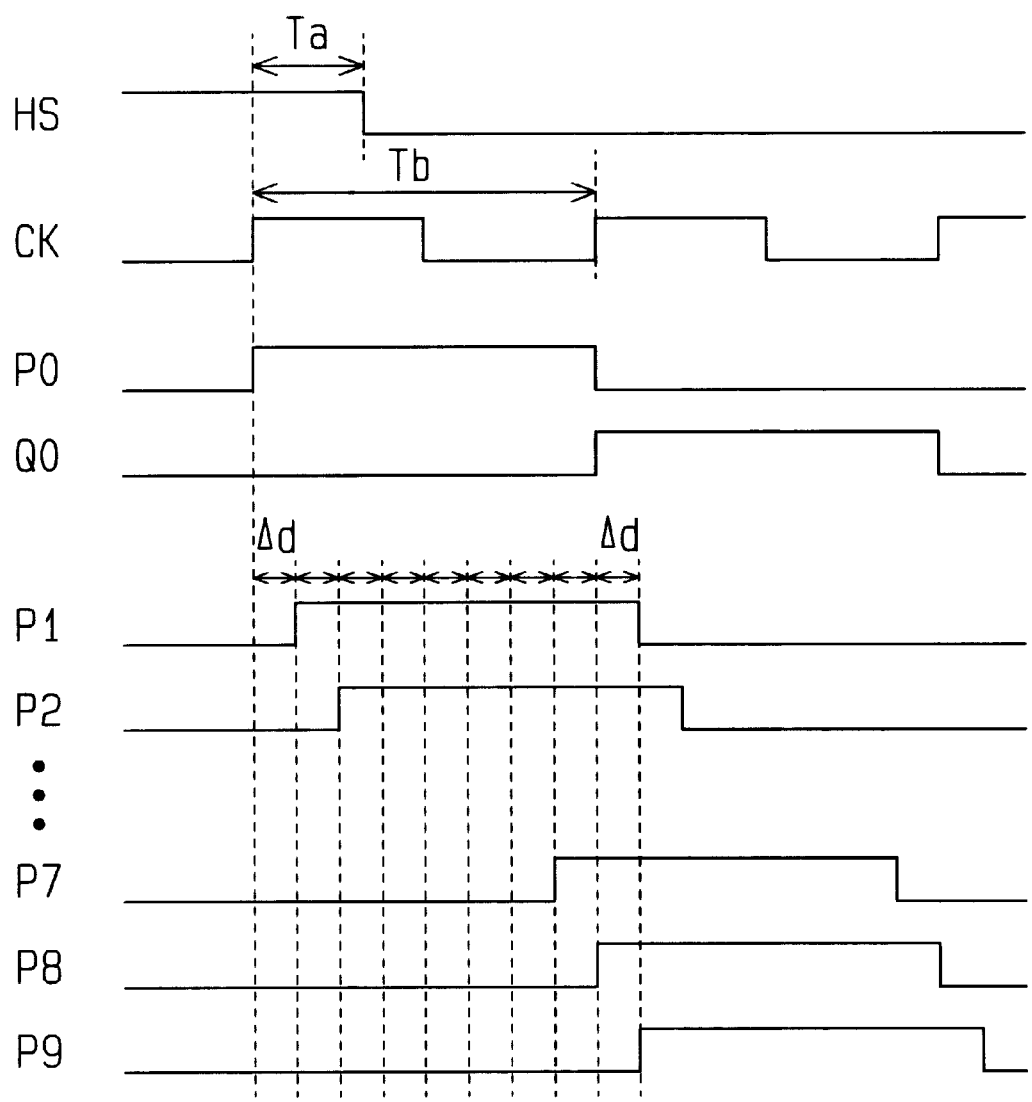
FIG. 13 is a timing chart which is referred to in explaining the operation of the phase difference detector in FIG. 12.

The decoder 40' decodes the count value from the counter 25 and outputs a pulse signal PO, which holds an H (High) level for one clock period of the reference clock signal CK when the count value reaches a predetermined count value (see FIG. 13). Specifically, the decoder 40' generates the pulse signal P0 when the counter 25 counts 910 pulses of the reference clock signal according to this embodiment. The decoder 40' supplies a pulse signal Q0, delayed by one clock period from the pulse signal P0, to the period determining circuit 30 for the determination of the period of the reference clock signal CK.

The delay circuit 28 includes a plurality of delay elements connected in series having the same delay time d (see FIG. 13). The delay circuit receives pulse signal P0 from the decoder 40' to delay the pulse signal P0, step by step, to generate pulse signals P1–P9 having a constant mutual phase difference d to one another.

The deviation time (Ta) determining circuit 29 receives the pulse signals P0–P9 in response to the falling edge of the horizontal sync signal HS and determines the time Ta based on the statuses of the pulse signals P0–P9. If the pulse signals P0–P9 have the levels of "HHHLLLLLLL", for example, the time Ta is determined to correspond to the transition period from "H" to "L" or a period between 18 to 27 nsec.

The period (Tb) determining circuit 30 receives the pulse signals P0–P9 in response to the rising edge of the reference clock signal CK and determines the period Tb of the reference clock signal CK based on the statuses of those pulse signals P0–P9. If the pulse signals P0–P9 have the levels of "HHHHHHHHLL", for example, the period Tb is determined to correspond to the transition period from "H" to "L" or a period between 63 to 72 nsec.

The above-described phase difference detector can detect the period of the reference clock signal CK and the phase difference between the reference clock signal CK and the horizontal sync signal HS without using a clock signal that has a higher frequency than the reference clock signal CK.

This phase difference detector does not determine the period of the horizontal sync signal HS. The timing signal generator in the image data processing apparatus using this phase difference detector therefore generates horizontal and vertical timing signals without consideration of the period of the horizontal sync signal HS.

Figure 14:
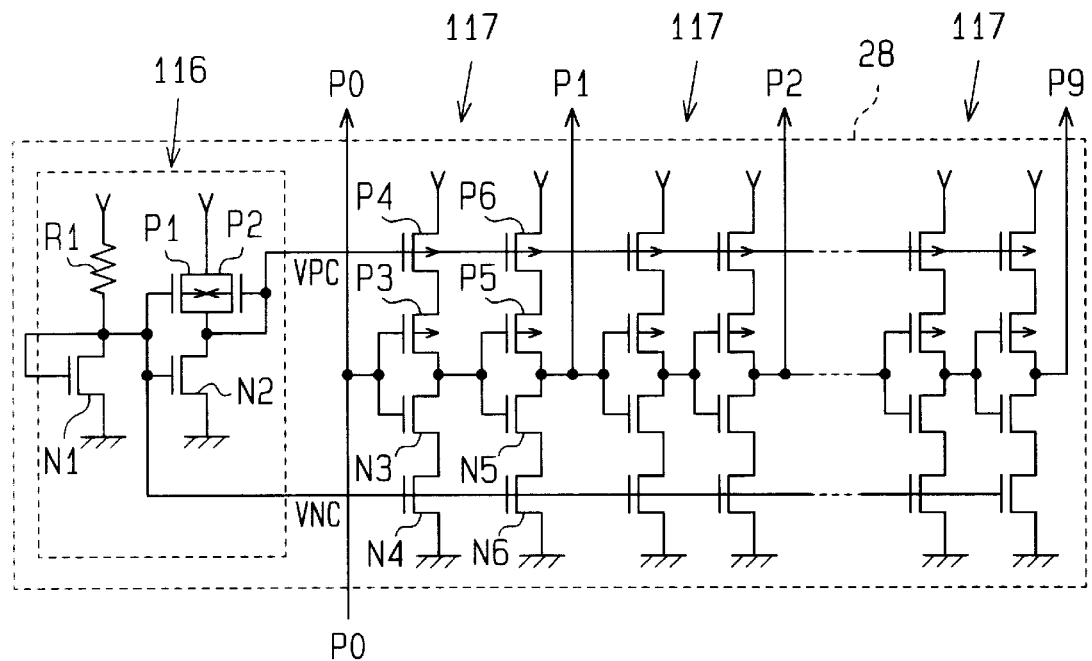
FIG. 14 is a circuit diagram showing a delay circuit, which is used in the phase difference detector/compensated data generator in FIG. 7 or the phase difference detector in FIG. 12.

FIG. 14 presents a circuit diagram showing the delay circuit 28 used in the phase difference detector/compensated data generator 17 in FIG. 7 and the phase difference detector in FIG. 12. The delay circuit 28 includes a temperature compensation section 116 and a plurality of series-connected delay sections 117.

The temperature compensation section 116 includes a resistor R1, two N channel MOS transistors N1 and N2, and two P channel MOS transistors P1 and P2. The resistor R1 and the NMOS transistor N1 are connected in series between a high-potential voltage supply and the ground. The NMOS transistor N1 has a gate connected to a first node between the resistor R1 and the NMOS transistor N1. A control voltage $V_{NC}$ on the N channel side is obtained from this first node.

The two PMOS transistors P1 and P2 are connected in parallel to the voltage supply with the NMOS transistor N2 connected between the PMOS transistors P1 and P2 and the ground. The PMOS transistor P1 and the NMOS transistor N2 have gates connected to the first node. The PMOS transistor P2 has a gate connected to a second node between the PMOS transistors P1 and P2 and the NMOS transistor N2. A control voltage $V_{PC}$ on the P channel side is obtained from this second node.

The control voltage $V_{NC}$ is determined by the ratio of the resistance of the resistor R1 to that of the NMOS transistor N1. The control voltage $V_{PC}$ is determined by the ratio of the resistance of the PMOS transistor P1 to that of the NMOS transistor N2. When the resistance of the NMOS transistor N1 increases due to a temperature change, the control voltage VNc increases. As a result, the resistance of the PMOS transistor P1 increases and the resistance of the NMOS transistor N2 decreases, so that the control voltage $V_{PC}$ falls. When the resistance of the NMOS transistor N1 decreases, the individual transistors operate in the reverse manner so that the control voltage $V_{NC}$ falls and the control voltage $V_{PC}$ rises.

Each of the delay sections 117 includes four NMOS transistors N3, N4, N5 and N6 and four PMOS transistors P3, P4, P5 and P6. The two NMOS transistors N3 and N4 and the two PMOS transistors P3 and P4 are connected in series between the high-potential voltage supply and the ground. The NMOS transistor N3 and PMOS transistor P3 have gates for receiving an input signal. The two NMOS transistors N5 and N6 and the two PMOS transistors P5 and P6 are connected in series between the high-potential voltage supply and the ground. The NMOS transistor N5 and PMOS transistor P5 have gates connected to a third node between the NMOS transistor N3 and the PMOS transistor P3. An output signal is acquired from a fourth node between the NMOS transistor N5 and the PMOS transistor P5. The NMOS transistors N4 and N6 on the ground side have gates to which the control voltage $V_{NC}$ from the temperature compensation section 116 is applied. The PMOS transistors P4 and P6 on the voltage supply side have gates to which the control voltage $V_{PC}$ from the temperature compensation section 116 is applied.

The delay sections 117 are connected in series. The first-stage delay section 117 receives the pulse signal P0, and any of the delay sections 117 at the second and subsequent stages receives a delayed pulse signal from the delay section 117 at the previous stage. In this manner, the pulse signals P0–P9 are acquired from the individual stages of delay sections 117. The individual delay sections 117 commonly receive the control voltages $V_{NC}$ and $V_{PC}$ from the temperature compensation section 116.

When the resistances of the NMOS transistors N3–N6 and the PMOS transistors P3–P6 change due to a temperature change, the delay of the output signal (delay time d) with A respect to the input signal also changes. However, the control voltages $V_{NC}$ and $V_{PC}$ from the temperature compensation section 116 are applied to the NMOS transistors N4 and N6 and the PMOS transistors P4 and P6 in such a way as to cancel the changes in resistances of the NMOS transistors N4 and N6 and the PMOS transistors P4 and P6. Therefore, the delay time d of each delay section 117 is kept substantially constant. Further, the PMOS transistor P2 in the temperature compensation section 116 together with the PMOS transistors P4 and P6 in each delay section 117 constitutes a current mirror circuit. In accordance with a change in the current that flows through the PMOS transistor P2, therefore, the current flowing through the individual MOS transistors in each delay section 117 is regulated. Even if the resistance of each MOS transistor greatly varies, therefore, the compensating operation by the temperature compensation section 116 can surely be executed. This prevents the delay time d of each delay section 117 from being varied significantly due to a temperature change. That is, a plurality of pulse signals P1–P9 having a predetermined phase difference d can stably be obtained from the input pulse signal P0.

Figure 15:
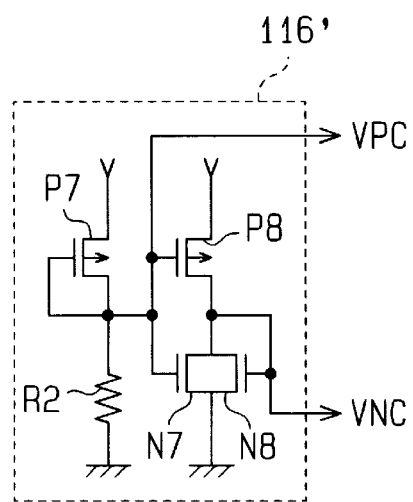
FIG. 15 is a circuit diagram showing another example of a delay section provided in the delay circuit in FIG. 14.

FIG. 15 is a circuit diagram showing another example of the temperature compensation section 116. The temperature compensation section 116' includes a resistor R2, two NMOS transistors N7 and N8 and two PMOS transistors P7 and P8.

The PMOS transistor P7 and the resistor R2 are connected in series between the high-potential voltage supply and the ground. The PMOS transistor P7 has a gate connected to a fifth node between the PMOS transistor P7 and the resistor R2. The control voltage $V_{PC}$ on the P channel side is obtained from this first node.

The PMOS transistor P8 is connected to the voltage supply. The two NMOS transistors N7 and N8 are connected in parallel between the PMOS transistor P8 and the ground. The PMOS transistor P8 and the NMOS transistor N7 have gates connected to the fifth node. The NMOS transistor N8 has a gate connected to a sixth node between the PMOS transistor P8 and the NMOS transistors N7 and N8. The control voltage $V_{NC}$ on the N channel side is obtained from this second node.

The control voltage $V_{PC}$ is determined by the ratio of the PMOS transistor P7 to that of the resistance of the resistor R2. The control voltage $V_{NC}$ is determined by the ratio of the resistance of the PMOS transistor P8 to that of the NMOS transistor N7. When the resistance of the PMOS transistor P7 increases due to a temperature change, therefore, the control voltage $V_{PC}$ decreases. As a result, the resistance of the PMOS transistor P8 decreases and the resistance of the NMOS transistor N7 decreases, thus causing the control voltage $V_{NC}$ to rise. When the resistance of the PMOS transistor P7 decreases, the individual transistors operate in the reverse manner so that the control voltage $V_{PC}$ rises and the control voltage $V_{NC}$ falls.

Although only two embodiments of the present invention have been described herein, it should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. An image data processing apparatus for consecutively producing luminance data and chrominance data from an image signal including a luminance component and a chrominance component, a horizontal sync signal and a color sync signal being overlaid on said image signal, said horizontal sync signal being used for determining a horizontal scan timing, said color sync signal being used to ensure synchronization for said chrominance component, said apparatus comprising:

a separator for separating said luminance component and said chrominance component from said image signal to produce a luminance signal and a chrominance signal; and a phase-locked loop for producing a reference clock signal synchronizing with said color sync signal and having a given period;

a detector, connected to said phase-locked loop, for a detecting a phase difference between said reference clock signal and said horizontal sync signal and a period of said reference clock signal, said detector delaying said reference clock signal in a shorter period than said period of said reference clock signal, in a step-by-step manner, to produce a plurality of delayed timing signals having step-by-step phase differences, said detector further contrasting said plurality of delayed timing signals with said horizontal sync signal and said reference clock signal to measure said phase difference and said period of said horizontal sync signal;

a compensator, connected to said detector, for setting a ratio for combining consecutive luminance data in accordance with said phase difference and said period of said reference clock signal and for combining consecutive luminance data in accordance with said ratio to generate compensated luminance data; and a timing signal generator, which is connected to said phase-locked loop and said detector, for frequency-dividing said reference clock signal in response to said horizontal sync signal to generate a timing signal for a horizontal scan.

2. The apparatus according to claim 1, wherein said detector includes:

a counter, which is connected to said phase-locked loop, for counting said reference clock signal and indicating a count value while resetting said count value in response to said horizontal sync signal;

a decoder, which is connected to said counter, for receiving and decoding said count value and generating a plurality of timing signals when said count value reaches a predetermined range including a predetermined value, said timing signals being shifted from one another by one clock period of said reference clock signal and each holding a predetermined level for said one clock period;

a first determining circuit, which is connected to said decoder, for receiving said plurality of timing signals in response to said horizontal sync signal and determining a period of said horizontal sync signal based on statuses of said timing signals;

a synthesizer, connected to said phase-locked loop and said decoder, for permitting passing of said reference clock signal while any one of said plurality of timing signals is holding said predetermined level to produce a synthesized timing signal having said plurality of timing signals synthesized, said synthesizer further simultaneously generating a delayed reference clock signal delayed by one clock period from said reference clock signal;

a delay circuit, which is connected to said synthesizer, for delaying said synthesized timing signal in a shorter period than said period of said reference clock signal, in a step-by-step manner, to produce a plurality of delayed timing signals having constant mutual phase differences in parallel;

a second determining circuit, which is connected to said delay circuit, for receiving said plurality of delayed timing signals in response to said horizontal sync signal and determining a phase difference between said reference clock signal and said horizontal sync signal based on statuses of said delayed timing signals; and a third determining circuit, which is connected to said synthesizer and said delay circuit, for receiving said plurality of delayed timing signals in response to said delayed reference clock signal and determining said period of said reference clock signal based on said statuses of said delayed timing signals.

3. The apparatus according to claim 2, wherein said delay circuit includes:

a temperature compensation section for producing first and second control voltages that complementarily change in accordance with a temperature change; and a plurality of series-connected delay sections, which are connected to said temperature compensation section, for producing said plurality of delayed timing signals while keeping its own delay times at a constant in accordance with said first and second control voltages.

4. The apparatus according to claim 3, wherein said temperature compensation section includes:

a resistor and a first MOS transistor, which are connected in series between a high-potential voltage supply and a low-potential voltage supply, said first MOS transistor having a gate connected to a first node between said resistor and said first MOS transistor, said first control voltage being output from said first node;

a first pair of complimentary MOS transistors, which are connected in series between said high-potential voltage supply and said low-potential voltage supply, each having a gate for receiving said first control voltage, said second control voltage being output from a second node between said first pair of complimentary MOS transistors; and a second MOS transistor, which is connected to one of said a first pair of complimentary MOS transistors in parallel, having a gate connected to said drain of an associated one of said first pair of complimentary MOS transistors, wherein each of said delay sections includes:

a second pair of complimentary MOS transistors, which are connected in series between said high-potential voltage supply and said low-potential voltage supply, each having a gate for receiving an input signal, an associated one of said delayed timing signals being output from a third node between said second pair of MOS transistors;

a third MOS transistor, which is connected between said second pair of complimentary MOS transistors and said high-potential voltage supply, having a gate for receiving one of said first and second control voltages; and a fourth MOS transistor, which is connected between said second pair of complimentary MOS transistors and said low-potential voltage supply, having a gate for receiving a remaining one of said first and second control voltages.

5. A detector circuit for detecting a phase difference between a first clock signal and second clock signal, said first clock signal having a constant period, said second clock signal having a period acquired by multiplying said constant period by integer, said detector circuit comprising:

a counter for counting said first clock signal and indicating a count value while resetting said count value in response to said second clock signal;

a decoder, which is connected to said counter, for receiving and decoding said count value and generating a plurality of timing signals when said count value reaches a predetermined range including a predetermined value, said timing signals being shifted from one another by one clock period of said first clock signal and each holding a predetermined level for said one clock period;

a first determining circuit, which is connected to said decoder, for receiving said plurality of timing signals in response to said second clock signal and determining a period of said second clock signal based on statuses of said timing signals;

a synthesizer, which is connected to said decoder, for permitting passing of said first clock signal while any one of said plurality of timing signals is holding said predetermined level to produce a synthesized timing signal having said plurality of timing signals synthesized, said synthesizer further simultaneously generating a delayed first clock signal delayed by one clock period from said first clock signal;

a delay circuit, which is connected to said synthesizer, for delaying said synthesized timing signal in a shorter period than said period of said first clock signal, in a step-like manner, to produce a plurality of delayed timing signals having constant mutual phase differences in parallel;

a second determining circuit, which is connected to said delay circuit, for receiving said plurality of delayed timing signals in response to said second clock signal and determining a phase difference between said first clock signal and said second clock signal based on statuses of said delayed timing signals; and a third determining circuit, which is connected to said synthesizer and said delay circuit, for receiving said plurality of delayed timing signals in response to said delayed first clock signal and determining said period of said first clock signal based on said statuses of said delayed timing signals.

6. A detector circuit for detecting a phase difference between a first clock signal and second clock signal, said first clock signal having a constant period, said second clock signal having a period acquired by multiplying said constant period by integer, said detecting circuit comprising:

a counter for counting said first clock signal and indicating a count value while resetting said count value in response to said second clock signal;

a decoder, connected to said counter, for receiving and decoding said count value and generating a timing signal when said count value reaches a predetermined value, said timing signal holding a predetermined level for said one clock period;

a delay circuit, which is connected to said decoder, for delaying said timing signal in a shorter period than said period of said first clock signal, in a step-like manner, to produce a plurality of delayed timing signals having constant mutual phase differences in parallel; and a determining circuit, which is connected to said delay circuit, for receiving said plurality of delayed timing signals in response to said second clock signal and determining a phase difference between said first clock signal and said second clock signal based on statuses of said delayed timing signals.

7. The circuit according to claim 6, wherein said delay circuit includes:

a temperature compensation section for producing first and second control voltages, which complementarily change in accordance with a temperature change; and a plurality of series-connected delay sections, which are connected to said temperature compensation section, for producing said plurality of delayed timing signals while keeping its own delay times at a constant in accordance with said first and second control voltages.

8. The circuit according to claim 7, wherein said temperature compensation section includes:

a resistor and a first MOS transistor, which are connected in series between a high-potential voltage supply and a low-potential voltage supply, said first MOS transistor having a gate connected to a first node between said resistor and said first MOS transistor, said first control voltage being output from said first node;

a first pair of complimentary MOS transistors, which are connected in series between said high-potential voltage supply and said low-potential voltage supply, each having a gate for receiving said first control voltage, said second control voltage being output from a second node between said first pair of complimentary MOS transistors; and a second MOS transistor, which is connected one of said a first pair of complimentary MOS transistors in parallel, having a gate connected to said drain of associated one of said a first pair of complimentary MOS transistors, wherein each of said delay sections includes:

a second pair of complimentary MOS transistors, which are connected in series between said high-potential voltage supply and said low-potential voltage supply, each having a gate for receiving an input signal, an associated one of said delayed timing signals being output from a third node between said second pair of MOS transistors;

a third MOS transistor, which is connected between said second pair of complimentary MOS transistors and said high-potential voltage supply, having a gate for receiving one of said first and second control voltages; and a fourth MOS transistor, which is connected between said second pair of complimentary MOS transistors and said low-potential voltage supply, having a gate for receiving a remaining one of said first and second control voltages.

9. A delay circuit for delaying a rectangular wave signal in a predetermined time interval in a step-like manner to produce a plurality of delayed timing signals having constant mutual phase differences, said delay circuit comprising:

a temperature compensation section for producing first and second control voltages that complementarily change in accordance with a temperature change; said temperature compensation section including:

a resistor and a first MOS transistor, which are connected in series between a high-potential voltage supply and a low-potential voltage supply, said first MOS transistor having a gate connected to a first node between said resistor and said first MOS transistor, said first control voltage being output from said first node;

a first pair of complimentary MOS transistors, which are connected in series between said high-potential voltage supply and said low-potential voltage supply, each having a gate for receiving said first control voltage, said second control voltage being output from a second node between said first pair of complimentary MOS transistors; and a second MOS transistor, which is connected one of said a first pair of complimentary MOS transistors in parallel, having a gate connected to said drain of associated one of said a first pair of complimentary MOS transistors; and a plurality of series-connected delay sections, which are connected to said temperature compensation section, for producing said plurality of delayed timing signals while keeping its own delay times at a constant in accordance with said first and second control voltages, each of said delay sections including:

a second pair of complimentary MOS transistors, which are connected in series between said high-potential voltage supply and said low-potential voltage supply, each having a gate for receiving an input signal, an associated one of said delayed timing signals being output from a third node between said second pair of complimentary MOS transistors;

a third MOS transistor, which is connected between said second pair of complimentary MOS transistors and said high-potential voltage supply, having a gate for receiving one of said first and second control voltages; and a fourth MOS transistor, which is connected between said second pair of complimentary MOS transistors and said low-potential voltage supply, having a gate for receiving a remaining one of said first and second control voltages.

* * * * *